United States Patent [19]

Barnett et al.

[11] Patent Number: 4,872,356

[45] Date of Patent: Oct. 10, 1989

[54] RESISTIVITY PROBE FIXTURE

[75] Inventors: Jay D. Barnett, Mountain Home; Bryan J. Ludwig, Meridian; Ernest E. Marks; Scott E. Moore, both of Boise, all of Id.

[73] Assignee: Micron Technology Inc., Boise, Id.

[21] Appl. No.: 290,458

[22] Filed: Dec. 27, 1988

[51] Int. Cl.4 ............................................. B08B 3/00
[52] U.S. Cl. ................................... 73/866.5; 134/113
[58] Field of Search ...................... 73/866.5, 53, 61 R; 134/113; 340/603; 324/65 R, 65 P

[56] References Cited

U.S. PATENT DOCUMENTS

| 2,577,612 | 12/1951 | Fay | 340/603 |
|---|---|---|---|
| 2,626,620 | 1/1953 | Smity | 134/113 |
| 4,778,532 | 10/1988 | McConnell et al. | 134/18 |
| 4,795,497 | 1/1989 | McConnell et al. | 134/18 |
| 4,806,912 | 2/1989 | Clack | 340/603 |

FOREIGN PATENT DOCUMENTS 477566 10/1969 Switzerland ........................ 134/113

Primary Examiner—Robert R. Raevis
Attorney, Agent, or Firm—Stan Protigal; Angus Fox

[57] ABSTRACT

Apparatus to enclose a resistivity probe, to be used with a semiconductor wafer washer. Said apparatus is detachable and easy to maintain; is made of readily available and inexpensive plumbing parts; substantially encloses said probe, reducing contamination; allows nitrogen purge of said probe, keeping it clean; fully submerges said probe in discharge fluid, improving measurement accuracy; and is compact enough to allow washers to be triple stacked.

9 Claims, 3 Drawing Sheets

RESISTIVITY PROBE FIXTURE

FIELD OF THE INVENTION

This invention relates generally to semiconductor manufacturing, and particularly to resistivity measurement during wafer washing. The novel fixture substantially encloses and submerges a probe which measures resistivity of wafer wash discharge fluid.

BACKGROUND OF THE INVENTION

In a semiconductor fabrication process, tiny electronic devices are mass manufactured on semiconductor wafers, which are thin slices of crystalline silicon ranging anywhere from 3 inches to 8 inches in diameter. The devices are so small that contact by dust particles can render them defective. Cleanliness is therefore an absolute necessity for profitable semiconductor fabrication.

Because many different types of chemicals and process steps are required to manufacture such devices, wafers must also be thoroughly cleaned between each step so that residual chemicals from one step do not interfere with the chemicals of the next step and render product defective.

Wafers are periodically cleaned during the process to remove particles and residual chemicals by washing them with de-ionized (DI) water. Simple washing is not enough—how do you know if the wash was effective? One way is to examine the discharge water from the washing process. If a wafer is dirty, the discharge water will be contaminated with particles and chemicals. If a wafer is clean, the discharge water will be pure.

Pure DI water has a high resistivity, which means that it tends not to conduct electricity. Dirty DI water has a lower resistivity: the contaminants in the water provide a conductive path for electricity. Measuring resistivity of the discharge water is therefore one way to verify wafer wash effectiveness.

Discharges from successive washes will show resistivities that start low and steadily increase as the discharges contain less and less contaminants. An empirical resistivity threshold value can then be determined that indicates a clean wafer and a final wash cycle.

A machine called a wafer washer performs such washings. The washer rapidly spins one or more wafers while spraying DI water (to wash) or dry nitrogen (to dry) on the wafers. Discharge water exits the washer and splashes by a resistivity probe, which is generally mounted on or near the washer discharge tube. The resistivity probe then provides a signal which indicates the purity of the discharge water and hence the cleanness of the wafers being washed.

The resistivity probe arrangement of one commonly used wafer washer needs improvement. This configuration is shown in FIG. 1. A discharge tube 101 exits into an open-topped discharge chamber 102. Discharge water splashes out of the tube 101 into the chamber 102, contacting a resistivity probe 103 and finally exiting through an exit hole 104. The chamber is attached to the back of the washer, generally enclosed in a plenum. This configuration, although adequate, has some disadvantages.

One disadvantage is the chamber construction. Because it is closely attached to the washer housing, chamber maintenance is difficult. The chamber is not easily replaceable or easily cleanable. An easily replaceable, even disposable (in the event of massive contamination) chamber would therefore be advantageous.

Another disadvantage is the substantially open configuration of the chamber, which exposes the resistivity probe to drafting plenum air, which is not optimally clean. A dirty probe will give false readings. Another problem with the open configuration is the tendency of contaminated water to splash out. If the contamination is hazardous and someone is near, a safety danger arises, as well as a contamination risk from the splashing water. A substantially closed chamber configuration would therefore be an improvement.

Another disadvantage is the splashy contact of the discharge water with the probe. A consistent and accurate resistivity reading is difficult when the water merely splashes by. The probe measures through water at one instant, and through air at another instant, so a false reading can be taken, the result being that a wafer is not washed thoroughly, risking subsequent yield loss. Therefore, finding a way to fully submerge the probe in the discharge water would be advantageous.

SUMMARY OF THE INVENTION

The objects of the invention are to answer the disadvantages of the above-described prior art, as well as provide advantages of its own.

One advantage of the invention is that it is detachable from the washer, enhancing maintenance and reducing down time of the washer. This invention essentially halved washer maintenance time.

Another advantage is that the invention is made of readily available, inexpensive, nonreactive PVC fittings and pipe. This renders the apparatus inexpensive, and disposable if desired.

Another advantage is that the invention has a substantially enclosed probe chamber, which reduces chamber contamination from outside air, and reduces the chance of water splashing out. This means that the wafer washer does not have to be mounted into a plenum to preserve cleanliness. This also means that the probe can be kept clean with a constant gas (such as nitrogen) purge between discharges, the chamber guiding the gas around the probe. Another advantage is that the resistivity probe is fully submerged when the washer discharges, resulting in more accurate measurements. This feature was accomplished with a smaller chamber and a bleed tube. The resulting improved accuracy saves money because wafers are preserved.

The invention also has another advantage in that it allows the washer discharge plumbing to be compacted. Where wafer washers could be double stacked under the prior art, the invention allows washers to be triple stacked, thus improving space efficiency.

DETAILED DESCRIPTION OF THE PREFERRED EMBODIMENTS

Figure 1:
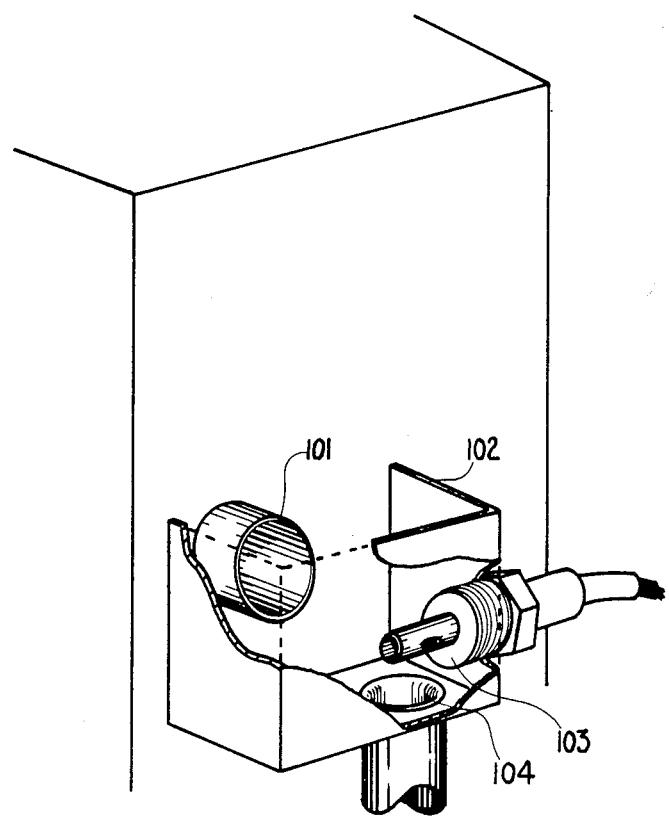
FIG. 1 shows prior art, the back side of a wafer washer.
Figure 2:
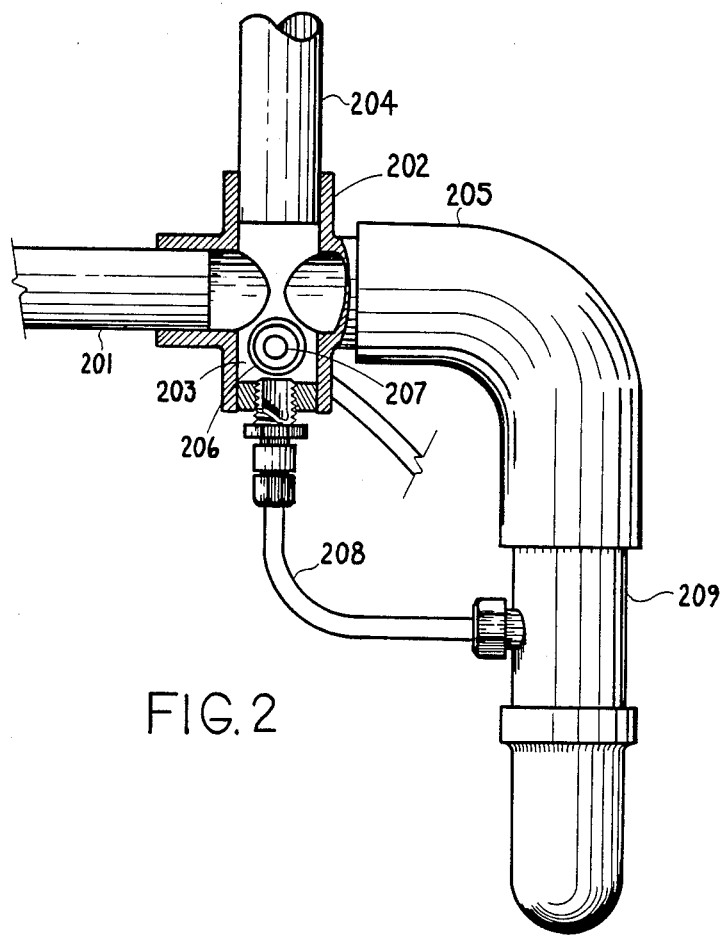
FIG. 2 shows a side view of the preferred embodiment, with a portion cut away to detail chamber.
Figure 3:
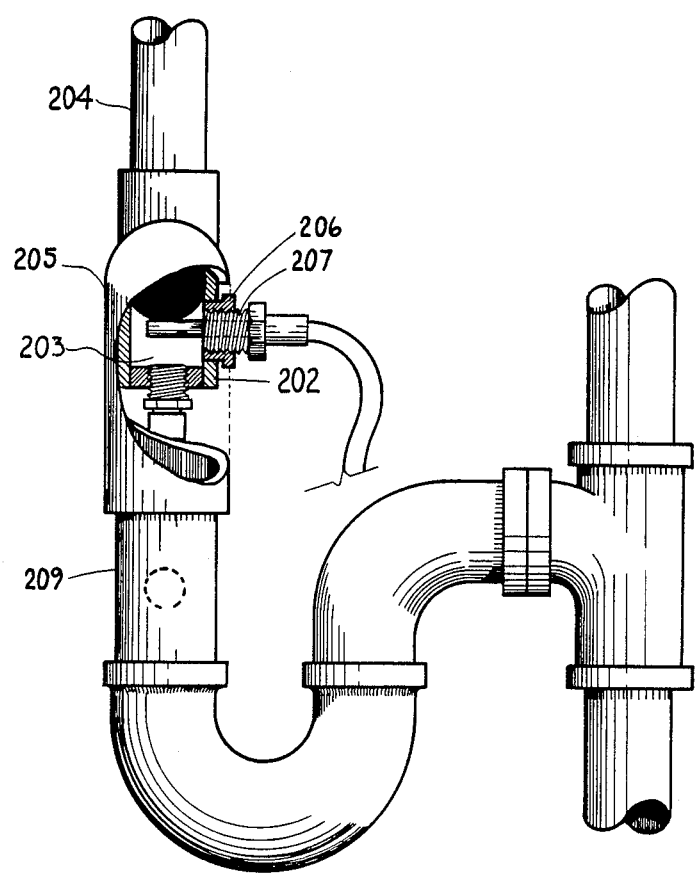
FIG. 3 shows a back view of the preferred embodiment, with a portion cut away to detail probe.

Referring to FIGS. 2 and 3, a wafer washer discharge tube 201 is attached to a cross or X fitting 202, whose lower stub forms a chamber 203 to temporarily hold discharge fluid. A breather tube 204 is attached to the fitting 202 top for chamber 203 venting. An exit tube 205 is attached to the fitting 202, opposite from the washer discharge tube 201.

The wall of the chamber 203 is bored to accept an internally threaded bushing 206, said bushing 206 being sealably cemented in place. The bushing 206 accepts and holds a commercially available resistivity probe 207 at a level within the chamber 203 below that of the discharge tube 201 and the exit tube 205, so that the probe 207 is submerged during discharge.

A bleed tube 208 communicates from the chamber 203 bottom to exit tube plumbing 209. The bleed tube 208 allows discharge fluid retained in the chamber 203 to drain. The bleed tube 208 is restricted so that it drains slower than the exit tube 205. This gives the advantage that the probe 207 is submerged during discharge to enable an accurate measurement, but the chamber 203 is drained dry after discharge, to start empty at the next discharge.

During a washer discharge, fluid enters the fitting 202 through the discharge tube 201 and exits through he exit tube 205, collecting in the chamber 203 and submerging the probe 207. The bleed tube 208 drains slowly so that the probe 207 remains submerged during discharge, yet after discharge the chamber 203 drains empty.

Between discharges the wafer washer sends gas such as nitrogen through the chamber 203, which helps keep the probe 207 clean. Breather tube 204 vents this gas.

Some useful features were incorporated into this design, such as positioning the probe 207 so that it will easily drain, and making the edge of the bushing 206 flush with the chamber 203 inner wall to further facilitate fluid drainage after discharge.

One important feature of the fitting is that it must be nonreactive: it must not react with the discharge fluid, and it must shed a minimum of particles into the fluid. PVC was used in the preferred embodiment.

Many modifications can be made to this invention without stepping outside of the boundaries of the claims. Flexible plumbing can be used. The exit tube can be eliminated, using the bleed tube as the exit, the bleed tube sized relative to typical discharge flow so that the chamber will still retain fluid only during discharge. The breather tube might be eliminated and a T or Y fitting used, the venting function being performed by existing sewer venting.

We claim:

1. Resistivity probe mounting apparatus for use with a wafer washing machine having fluid discharge means, said apparatus comprising:
   (a) a fitting, having a probe submersion chamber, having an inlet in fluid communication with the fluid discharge means, and having a primary outlet, the chamber lower than said inlet and outlet so that it will retain discharge fluid;
   (b) means for positioning a probe within said chamber so that the chamber when full will submerge said probe; and
   (c) said chamber having a secondary outlet at its bottom, said secondary outlet being restricted so that during a typical discharge the chamber will be filled, yet will drain empty after discharge.

2. Apparatus of claim 1, wherein the fitting is easily detachable from the fluid discharge means, and the chamber is substantially enclosed.

3. Apparatus of claim 2, wherein the apparatus is a junction fitting, having a first stub as the inlet, a second stub as the primary outlet, and a third stub defining the chamber, the third stub being lower than the other stubs.

4. Apparatus of claim 3, wherein the fitting is nonreactive.

5. Apparatus of claim 2, further comprising:
   a breather opening at the chamber top, for venting.

6. Apparatus of claim 5, wherein the apparatus is a junction fitting, having a first stub as the inlet, a second stub as the primary outlet, a third stub defining the chamber, and a fourth stub as the breather opening, the third stub being lower than the other stubs.

7. Apparatus of claim 6, wherein the fitting is a X-fitting.

8. Apparatus of claim 7, wherein the fitting is nonreactive.

9. Apparatus of claim 1, wherein the fitting is nonreactive.

* * * * *